(12) United States Patent
Gungor et al.

(10) Patent No.: US 11,598,003 B2
(45) Date of Patent: Mar. 7, 2023

(54) SUBSTRATE PROCESSING CHAMBER HAVING HEATED SHOWERHEAD ASSEMBLY

(71) Applicant: APPLIED MATERIALS, INC., Santa Clara, CA (US)

(72) Inventors: Faruk Gungor, San Jose, CA (US); Dien-Yeh Wu, San Jose, CA (US); Joel M. Huston, San Jose, CA (US); Mei Chang, Saratoga, CA (US); Xiaoxiong Yuan, San Jose, CA (US); Kazuya Daito, Milipitas, CA (US); Avgerinos V. Gelatos, Scotts Valley, CA (US); Takashi Kuratomi, San Jose, CA (US); Yu Chang, San Jose, CA (US); Bin Cao, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 447 days.

(21) Appl. No.: 15/702,234

(22) Filed: Sep. 12, 2017

(65) Prior Publication Data
US 2019/0078210 A1    Mar. 14, 2019

(51) Int. Cl.
*C23C 16/455*    (2006.01)
*C23C 16/505*    (2006.01)
(Continued)

(52) U.S. Cl.
CPC ...... *C23C 16/45565* (2013.01); *C23C 16/458* (2013.01); *C23C 16/4557* (2013.01);
(Continued)

(58) Field of Classification Search
CPC .......... C23C 16/45565; C23C 16/4557; C23C 16/45591
See application file for complete search history.

(56) References Cited

U.S. PATENT DOCUMENTS 5,106,453 A * 4/1992 Benko ................... C23C 16/455
                                                          117/104
5,741,363 A * 4/1998 Van Buskirk ......... C23C 16/455
                                                          118/715
(Continued)

FOREIGN PATENT DOCUMENTS

JP    2007134702 A    5/2007

OTHER PUBLICATIONS

International Search Report and Written Opinion dated Dec. 17, 2018 for PCT Application No. PCT/US2018/047161.

*Primary Examiner* — Aiden Lee
(74) *Attorney, Agent, or Firm* — Moser Taboada

(57) ABSTRACT

Apparatus for processing a substrate are provided herein. In some embodiments a showerhead assembly includes a gas distribution plate having a plurality of apertures; a holder having a wall, an radially inwardly extending flange extending from a lower portion of the wall and coupled to the gas distribution plate, and a radially outwardly extending flange extending from an upper portion of the wall, wherein the wall has a thickness between about 0.015 inches and about 0.2 inches; and a heating apparatus disposed above and spaced apart from the gas distribution plate, wherein the heating apparatus includes a heater configured to heat the gas distribution plate.

7 Claims, 3 Drawing Sheets

(51) Int. Cl.
*C23C 16/46* (2006.01)
*C23C 16/458* (2006.01)

(52) U.S. Cl.
CPC .......... *C23C 16/4586* (2013.01); *C23C 16/46* (2013.01); *C23C 16/505* (2013.01)

(56) References Cited

U.S. PATENT DOCUMENTS

| | | | |
|---|---|---|---|
| 6,364,949 B1* | 4/2002 | Or | C23C 16/4412 |
| | | | 118/69 |
| 6,565,661 B1* | 5/2003 | Nguyen | C23C 16/4557 |
| | | | 118/715 |
| 6,772,827 B2 | 8/2004 | Keller et al. | |
| 7,337,745 B1 | 3/2008 | Komino et al. | |
| 7,572,337 B2* | 8/2009 | Rocha-Alvarez | |
| | | | C23C 16/4405 |
| | | | 118/715 |
| 9,206,512 B2 | 12/2015 | Nguyen et al. | |
| 2003/0205202 A1 | 11/2003 | Funaki et al. | |
| 2004/0050492 A1* | 3/2004 | Tsuei | C23C 16/5096 |
| | | | 156/345.33 |
| 2004/0118519 A1* | 6/2004 | Sen | H01J 37/3244 |
| | | | 156/345.33 |
| 2004/0206305 A1* | 10/2004 | Choi | C23C 16/45565 |
| | | | 118/715 |
| 2005/0183827 A1 | 8/2005 | White et al. | |
| 2006/0137607 A1 | 6/2006 | Seo et al. | |
| 2006/0228490 A1* | 10/2006 | Wang | C23C 16/45565 |
| | | | 427/457 |
| 2008/0041308 A1 | 2/2008 | Hong et al. | |
| 2008/0099448 A1 | 5/2008 | Larson et al. | |
| 2008/0241377 A1* | 10/2008 | Faguet | C23C 16/452 |
| | | | 427/248.1 |
| 2008/0242085 A1 | 10/2008 | Fischer et al. | |
| 2010/0065214 A1 | 3/2010 | Kennedy et al. | |
| 2010/0230051 A1 | 9/2010 | Iizuka | |
| 2011/0197814 A1 | 8/2011 | Baek et al. | |
| 2014/0209027 A1* | 7/2014 | Lubomirsky | B05B 1/005 |
| | | | 118/724 |
| 2015/0111394 A1* | 4/2015 | Hsu | H01J 37/32715 |
| | | | 438/786 |
| 2016/0097119 A1* | 4/2016 | Cui | C23C 16/4405 |
| | | | 134/1.1 |
| 2016/0192444 A1 | 6/2016 | Matsushita et al. | |
| 2017/0159181 A1 | 6/2017 | Toyoda | |

* cited by examiner

SUBSTRATE PROCESSING CHAMBER HAVING HEATED SHOWERHEAD ASSEMBLY

FIELD

Embodiments of the disclosure generally relate to apparatus for processing a substrate.

BACKGROUND

In some chemical vapor (CVD) processes, "capping" of a metallic layer may be desirable. Capping comprises forming a ceramic layer above a previously deposited metallic layer, in order to avoid oxidation of the metallic layer. For example, when a titanium (Ti) layer is deposited on a substrate, forming a titanium nitride (TiN) layer atop the Ti layer may be desirable to prevent oxidation of the underlying Ti layer. One method for forming the TiN layer is to use a nitrogen plasma to achieve nitridation of an upper portion of the Ti layer. However, the inventors have discovered that because the showerhead in the processing chamber does not reach a sufficiently high temperature, some precursor remains in the apertures of the showerhead after the capping. The remaining precursor in the showerhead contaminates the Ti layer formed on subsequent substrates processed in the chamber.

Therefore, the inventors have provided embodiments of improved showerhead assemblies and processing chambers incorporating same for processing of a substrate.

SUMMARY

Apparatus for processing a substrate are disclosed herein. In some embodiments, a showerhead assembly includes a gas distribution plate having a plurality of apertures; a holder having a wall, a radially inwardly extending flange extending from a lower portion of the wall and coupled to the gas distribution plate, and a radially outwardly extending flange extending from an upper portion of the wall, wherein the wall has a thickness between about 0.015 inches and about 0.2 inches; and a heating apparatus disposed above and spaced apart from the gas distribution plate, wherein the heating apparatus includes a heater configured to heat the gas distribution plate.

In some embodiments, a substrate processing chamber includes a chamber body; a top plate disposed above the chamber body to define interior volume within the chamber body and the top plate; a substrate support disposed in a lower portion of the interior volume, wherein the substrate support includes a first heater; a gas distribution plate having a plurality of apertures and disposed in an upper portion of the interior volume opposite the substrate support; and a heating apparatus having a second heater and disposed between and spaced apart from the gas distribution plate and the top plate such that a gas flow path is defined in which gas flows from above the heating apparatus, around the heating apparatus, and beneath the heating apparatus into the gas distribution plate.

In some embodiments, a substrate processing chamber includes a chamber body; an electrically conductive top plate disposed above the chamber body to define interior volume within the chamber body and the electrically conductive top plate; a substrate support disposed in a lower portion of the interior volume, wherein the substrate support includes a first heater; a gas distribution plate disposed in an upper portion of the interior volume opposite the substrate support; a heating apparatus having a second heater and disposed between and spaced apart from the gas distribution plate and the electrically conductive top plate such that a gas flow path is defined in which gas flows from above the heating apparatus, around the heating apparatus, and beneath the heating apparatus into the gas distribution plate; a holder having a wall, an radially inwardly extending flange extending from a lower portion of the wall and coupled to the gas distribution plate, and a radially outwardly extending flange extending from an upper portion of the wall and disposed between the chamber body and the electrically conductive top plate; and an RF gasket disposed between the radially outwardly extending flange and the electrically conductive top plate to facilitate coupling of RF energy from the electrically conductive top plate, through the holder, and into the gas distribution plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, that the appended drawings illustrate only typical embodiments of the disclosure and are therefore not to be considered limiting of scope, for the disclosure may admit to other equally effective embodiments.

Figure 1:
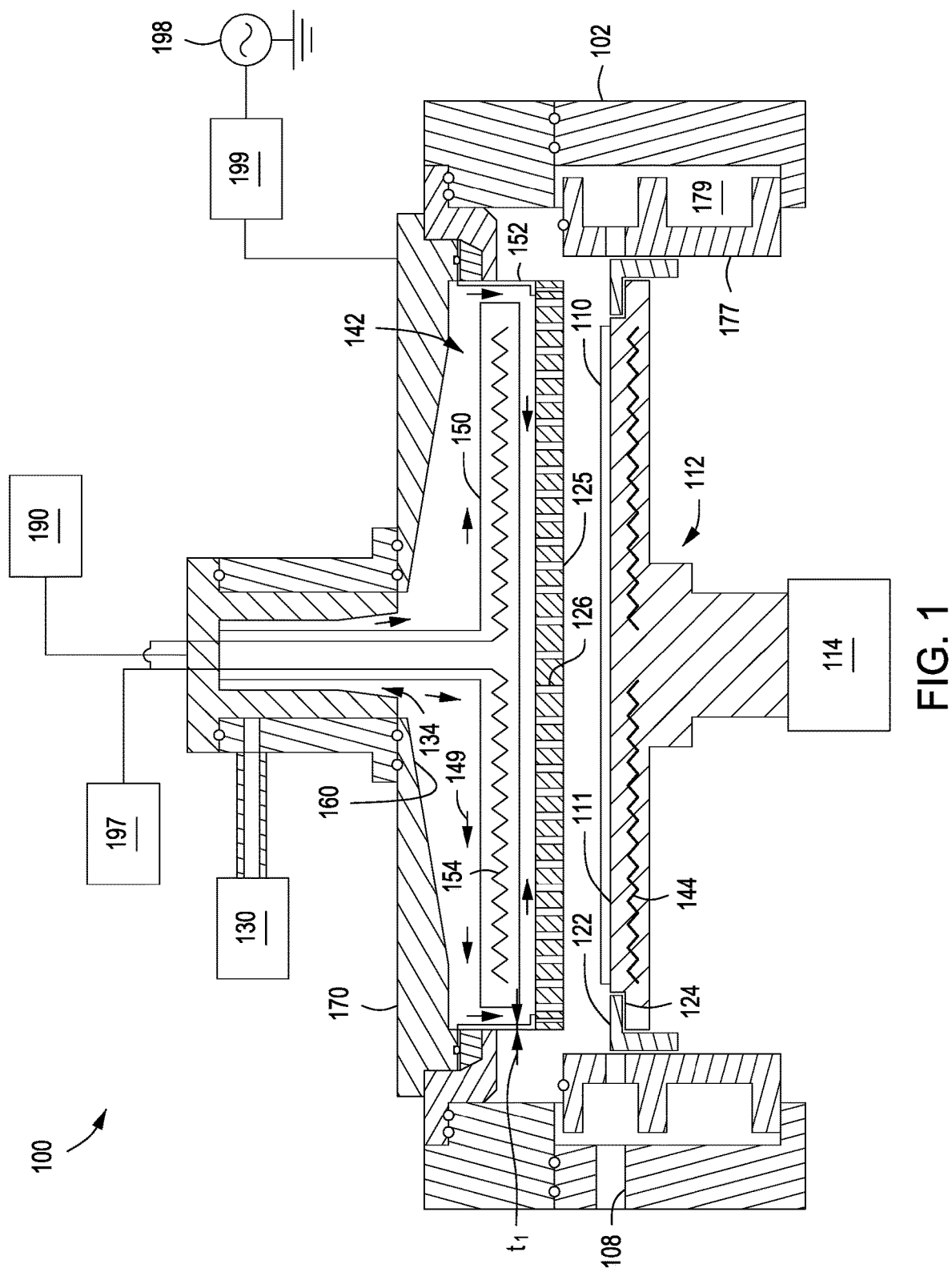
FIG. 1 depicts a schematic view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide a showerhead assembly that may be used in substrate processing chambers, such as a chemical vapor deposition (CVD) chamber to ensure proper operating temperatures of a gas distribution plate of the showerhead assembly. The inventive showerhead advantageously reduces or eliminates precursors left behind in a gas distribution plate, thus reducing or eliminating contamination of substrates being processed. Examples of suitable processing chambers for incorporation of the apparatuses described herein include CVD deposition chambers available from Applied Materials, Inc., of Santa Clara, Calif. The following process chamber description is provided for context and exemplary purposes, and should not be interpreted or construed as limiting the scope of the disclosure.

Figure 2:
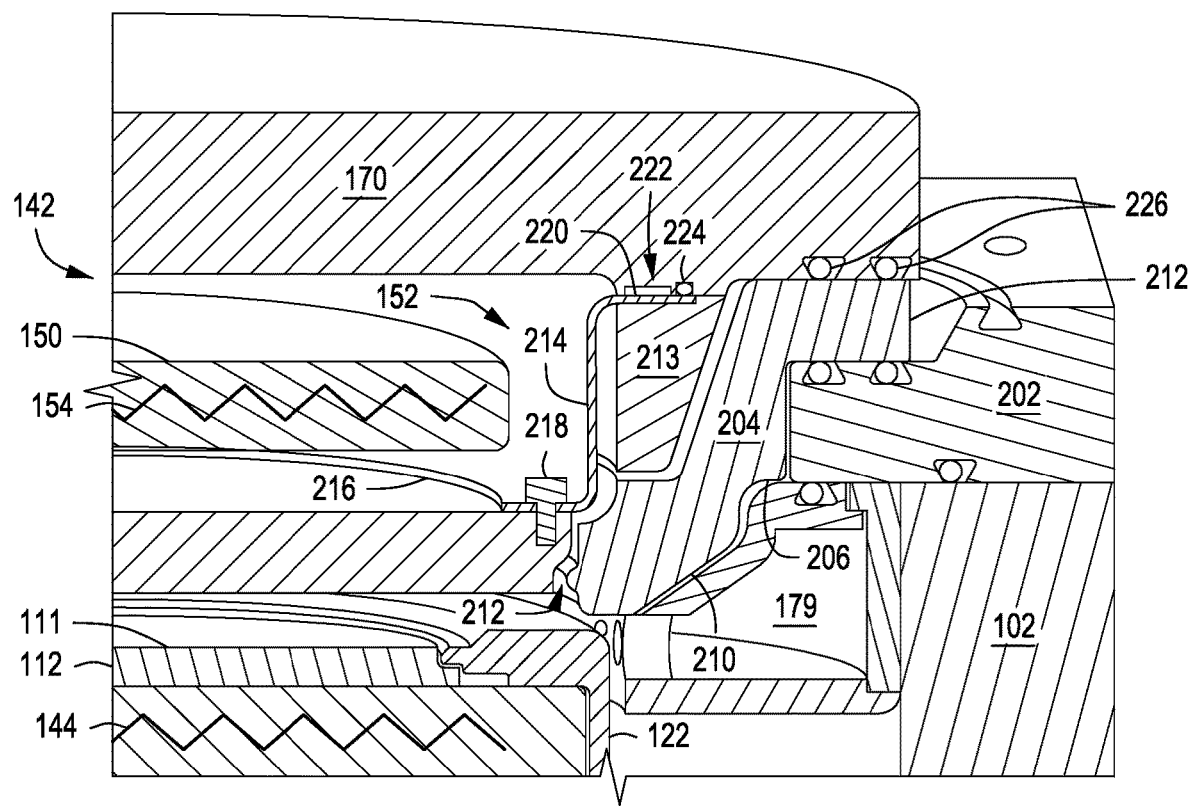
FIG. 2 depicts a cross-sectional view of a portion of the process chamber of FIG. 1.

FIG. 1 is a schematic cross-sectional view of a substrate processing chamber (process chamber 100) including a gas delivery system 130 adapted for CVD processes in accordance with some embodiments of the present disclosure. FIG. 2 is a cross-sectional view of a portion of the process chamber 100. Process chamber 100 includes a chamber body 102 having a processing volume within the chamber body 102 and beneath the chamber lid assembly 132. Slit valve 108 in the process chamber 100 provides access for a robot (not shown) to deliver and retrieve a substrate 110, such as a 200 mm or 300 mm semiconductor wafer or a glass substrate, to and from the process chamber 100. A chamber liner 177 is disposed along the walls of the process chamber 100 to protect the chamber from corrosive gases used during processing/cleaning.

A substrate support 112 supports the substrate 110 on a substrate receiving surface 111 in the process chamber 100. The substrate support 112 is mounted to a lift motor 114 for raising and lowering the substrate support 112 and the substrate 110 disposed on the substrate support. A lift plate 116 (shown in FIG. 2), connected to a lift motor 118, is mounted in the process chamber 100 to raise and lower lift pins 120 movably disposed through the substrate support 112. The lift pins 120 raise and lower the substrate 110 over the surface of the substrate support 112. The substrate support 112 may include a vacuum chuck (not shown), an electrostatic chuck (not shown), or a clamp ring (not shown) for securing the substrate 110 to the substrate support 112 during a deposition process.

The temperature of the substrate support 112 may be adjusted to control the temperature of the substrate 110. For example, substrate support 112 may be heated using a first heater, such as one or more first resistive heater elements 144, or may be heated using radiant heat, such as heating lamps (shown in FIG. 3). A purge ring 122 may be disposed on the substrate support 112 to define a purge channel 124 which provides a purge gas to a peripheral portion of the substrate 110 to prevent deposition on the peripheral portion of the substrate 110.

Gas delivery system 130 is disposed at an upper portion of the chamber body 102 to provide a gas, such as a process gas and/or a purge gas, to process chamber 100. A vacuum system (not shown) is in communication with a pumping channel 179 to evacuate any desired gases from the process chamber 100 and to help maintain a desired pressure or pressure range inside the process chamber 100.

In some embodiments, the chamber lid assembly 132 includes a gas dispersion channel 134 extending through a central portion of the chamber lid assembly 132. As shown in FIG. 1, the gas dispersion channel 134 extends perpendicularly toward the substrate receiving surface 111 through a top plate 170, and to lower surface 160. In some embodiments, an upper portion of the gas dispersion channel 134 is substantially cylindrical and a lower portion of the gas dispersion channel 134 tapers away from a central axis of the gas dispersion channel 134. The lower surface 160 is sized and shaped to substantially cover the substrate 110 disposed on the substrate receiving surface 111 of the substrate support 112. In some embodiments, the lower surface 160 tapers from an outer edge of the top plate 170 towards the gas dispersion channel 134. The lower surface 160 may contain one or more surfaces, such as a straight surface, a concave surface, a convex surface, or combinations thereof to control the flow of gases through the gas dispersion channel 134.

The gas delivery system 130 may provide one or more gasses to the gas dispersion channel 134 to process the substrate 110. In some embodiments, the gas delivery system 130 may be coupled to the gas dispersion channel 134 via one gas inlet. In some embodiments, the gas delivery system may be alternatively be coupled to the gas dispersion channel 134 via a plurality of inlets.

The process chamber 100 further includes a showerhead assembly 142 having a gas distribution plate 125 having a plurality of apertures 126 disposed through the gas distribution plate 125, a heating apparatus 150 disposed between the gas distribution plate 125 and the top plate 170, and a holder 152 configured to hold the gas distribution plate 125 in place. The gas distribution plate 125 extends over the surface of the gas dispersion channel 134 such that the only pathway from the gas dispersion channel 134 to the substrate is through the plurality of apertures 126 of the gas distribution plate 125. The holder 152 has a first thickness $t_1$ sufficient to minimize heat loss from the gas distribution plate 125 to the process chamber 100. Although the first thickness $t_1$ is dependent on the material that the holder 152 is formed of, the first thickness t1 should be robust enough to support the weight of the gas distribution plate 125 yet small enough to minimize heat loss from the gas distribution plate 125. In some embodiments, the first thickness $t_1$ may be between about 0.015 inches and about 0.2 inches. In some embodiments, the first thickness $t_1$ may alternatively be between about 0.05 inches and about 0.15 inches.

The holder 152 may be formed of any process-compatible material that can support the gas distribution plate 125 while maintaining a relatively small thickness (as outlined above). In some embodiments, the material has a first coefficient of thermal expansion (CTE) that is within about 5% of a second CTE of the gas distribution plate. The holder 152 is formed of an electrically conductive material that has a thermal conductivity less than about 30 W/m·K to minimize heat loss from the gas distribution plate 125 and to couple RF energy to the gas distribution plate 125. In some embodiments, the holder 152 may be formed of an austenitic nickel-chromium-based superalloy such as, for example, INCONEL 625®. In some embodiments, the holder 152 may alternatively be formed of stainless steel or a nickel alloy.

The heating apparatus 150 is spaced apart from the gas distribution plate 125 and the top plate 170 such that a gas flow path is defined in which gas flows from above the heating apparatus 150, around the heating apparatus 150, and beneath the heating apparatus into the gas distribution plate, as indicated by arrows 149.

The inventors have discovered that to maintain the gas distribution plate 125 at a temperature sufficient to ensure that little or no precursor residue remains in the apertures 126, the gas distribution plate 125 must be maintained at a sufficiently high temperature. To achieve such a temperature, the gas distribution plate 125 is heated from above by the heating apparatus 150 and below by the substrate support 112 such that a temperature of the gas distribution plate 125 is maintained at a predetermined temperature greater than about 300° C. during processing. In some embodiments, the gas distribution plate is alternatively maintained at a predetermined temperature greater than about 400° C. during processing. The heating apparatus 150 includes a second heater such as, for example, one or more second resistive heater elements 154. A heater power source 197 is electrically coupled to the second heater to power the second heater. As explained above, the substrate support includes a first heater such as, for example, one or more first resistive heater elements 144. Together, the first and second heaters maintain the gas distribution plate 125 at the predetermined temperature discussed above.

Figure 3:
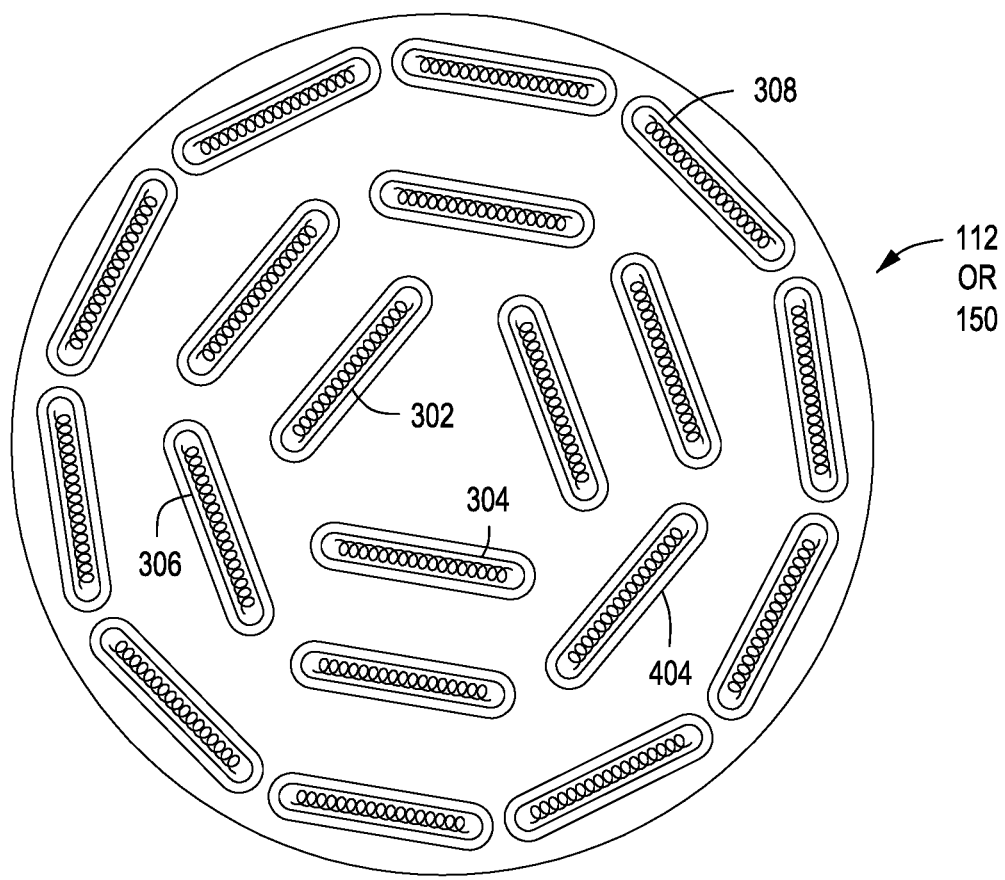
FIG. 3 depicts a schematic top view of a heater disposed in a substrate support in accordance with some embodiments of the present disclosure.

Although FIG. 1 depicts the first and second heaters as resistive heating elements, in some embodiments, the first heater of the substrate support 112 and/or the second heater of the heating apparatus 150 may include one or more first heating lamps 302, as depicted in FIG. 3. In some embodiments, the one or more first heating lamps 302 may be arranged in a plurality of independently controllable first heating zones 304, 306, 308. Although three heating zones are depicted in FIG. 3, fewer or more zones are contemplated. FIG. 3 depicts heating lamps disposed in the substrate support 112 or the heating apparatus 150.

Returning to FIG. 1, in some embodiments, the process chamber 100 may include a radio frequency (RF) power source 198 electrically coupled to the top plate 170 via a match network 199 to deliver RF energy to the substrate processing chamber (e.g., to the gas distribution plate 125). To facilitate coupling of the RF energy to the gas distribution plate 125, the top plate 170 is formed of an electrically conductive material such as, for example, stainless steel, aluminum, nickel-plated aluminum, nickel, alloys thereof, or other suitable materials. In some embodiments, the process chamber 100 further includes a remote plasma source (RPS) 190.

FIG. 2 illustrates a cross-sectional view of a portion of the process chamber 100 in accordance with some embodiments of the present disclosure. As depicted in FIG. 2, the process chamber 100 further includes a lid plate 202 disposed atop walls of the chamber body 102 and an isolator ring 204. The isolator ring 204 is configured to electrically insulate the chamber body 102 from the RF energy delivered to the gas distribution plate 125. In some embodiments, the isolate ring 204 may be formed of aluminum oxide, aluminum nitride, or similar process-compatible materials. The lid plate is configured to couple a chamber lid (not shown) to the chamber body 102. In some embodiments, the isolator ring 204 includes a body 206, an outwardly extending portion 208 extending from an upper portion of the body 206, and an inwardly extending portion 210 extending from a lower portion of the body 206. The inwardly extending portion 210 is adjacent and spaced apart from the gas distribution plate 125 by a gap 212 to accommodate thermal expansion of the gas distribution plate 125. In some embodiments, a width of the gap 212 is between about 0.04 inches when the gas distribution plate 125 is at maximum thermal expansion and about 0.08 inches when the gas distribution plate 125 is at room temperature (i.e., no thermal expansion). In some embodiments, the process chamber 100 also includes a washer ring 213 disposed between the holder 152 and the isolator ring 204 to support the holder 152. In some embodiments, the washer ring 213 may be formed of aluminum, stainless steel, or similar process-compatible materials.

As also depicted in FIG. 2, the holder 152 includes a wall 214, a radially inwardly extending flange 216 extending from a lower portion of the wall 214 and coupled to the gas distribution plate 125 via a fixation element 218, and a radially outwardly extending flange 220 extending from an upper portion of the wall 214 and disposed between the chamber body (i.e., the washer ring 213) and the top plate 170. In some embodiments, the fixation element 218 may be a screw (as shown in FIG. 2). In some embodiments, the radially inwardly extending flange 216 may alternatively be welded to the gas distribution plate 125. To minimize heat loss from the holder 152 and thus, the gas distribution plate 125, direct contact between the top plate 170 and the holder 152 may be minimized. For example, the top plate 170 may have a geometric configuration that reduces direct surface contact between the holder 152 and the top plate 170. In some embodiments, and as shown in FIG. 2, the top plate 170 may have a minimum contact region 222, which includes an annular channel having two adjacent annular legs on either side of the channel which sit atop the radially outwardly extending flange 220.

In some embodiments, an RF gasket 224 may also be disposed between the top plate 170 and the radially outwardly extending flange 220 to improve the coupling of RF power from the top plate 170, through the holder 152, and to the gas distribution plate 125. In some embodiments, the process chamber 100 may include seals 226 (e.g., o-rings) disposed at various component interfaces to ensure the process chamber 100 maintains a vacuum tight seal.

Returning to FIG. 1, in some embodiments, the gas distribution plate 125 is formed of a non-corrosive material such as, for example, nickel. In some embodiments, each of the plurality of apertures 126 may have an equivalent fluid conductance. In some embodiments, a density of the plurality of apertures 126 (e.g., the number of apertures or the size of the openings of the apertures per unit area) may vary across the gas distribution plate 125 to achieve a desired deposition profile on the substrate 110. For example, a higher density of apertures 126 may be disposed at a center of the gas distribution plate 125 to increase the deposition rate at the center of the substrate relative to the edge of the substrate to further improve deposition uniformity.

Referring to FIGS. 1 and 2, in a processing operation, substrate 110 is delivered to process chamber 100 through slit valve 108 by a robot (not shown). Substrate 110 is positioned on substrate support 112 through cooperation of lift pins 120 and the robot. Substrate support 112 raises substrate 110 into close opposition to a lower surface of the gas distribution plate 125. A first gas flow (e.g., a titanium-containing precursor gas) may be injected into gas dispersion channel 134 of process chamber 100 by the gas delivery system 130 together or separately (i.e., pulses) with a second gas flow.

The gas travels through gas dispersion channel 134 and subsequently through the plurality of apertures 126 in the gas distribution plate 125. The gas is then deposited on the surface of substrate 110. Subsequently, a plasma (e.g., nitrogen-containing plasma) may be provided to the process chamber 100 via the RPS 190. For example, a nitrogen plasma may be provided to the process chamber 100 to form a TiN layer from the uppermost portion of a previously deposited Ti layer. Throughout the processing operation, the first heater in the substrate support 112 (e.g., one or more first resistive heater elements 144) and the second heater in the heating apparatus 150 (e.g., one or more second resistive heater elements 154) may heat the gas distribution plate 125 to a predetermined temperature to heat any solid byproducts that have accumulated on the gas distribution plate 125 and/or in the apertures 126. As a result, any accumulated solid byproducts are vaporized. The vaporized byproducts are evacuated by a vacuum system (not shown) and pumping channel 179. In some embodiments, the predetermined temperature is greater than about 300° C. during processing. In some embodiments, the predetermined temperature is greater than about 400° C. during processing.

Other embodiments of a chamber adapted for chemical vapor deposition incorporate one or more of these features. Although disclosed in connection with chemical vapor deposition chambers and processes, process chambers configured for other processes where high temperature showerheads are desirable may also benefit from the teachings disclosed herein.

While the foregoing is directed to some embodiments of the present disclosure, other and further embodiments may be devised without departing from the basic scope thereof.

What is claimed is:

1. A substrate processing chamber, comprising:
   a chamber body;

an electrically conductive top plate disposed above the chamber body to define interior volume within the chamber body and the electrically conductive top plate;

a substrate support disposed in a lower portion of the interior volume, wherein the substrate support includes a first heater;

a gas distribution plate disposed in an upper portion of the interior volume opposite the substrate support, wherein the electrically conductive top plate and the gas distribution plate at least partially define an inner volume of a showerhead assembly;

a heating apparatus having a second heater and disposed between and spaced apart from the gas distribution plate and the electrically conductive top plate, wherein the second heater is configured to force all gases introduced into the inner volume of the showerhead assembly to flow from above the heating apparatus, around the heating apparatus along an uppermost surface and an outermost sidewall of the heating apparatus, and beneath the heating apparatus into the gas distribution plate, wherein the second heater includes, embedded in a heater plate, one or more second resistive heater elements or one or more second heating lamps;

a holder having a wall, a flange extending radially inwardly from a lower portion of the wall and coupled to the gas distribution plate, and a flange extending radially outwardly from an upper portion of the wall and disposed between the chamber body and the electrically conductive top plate, wherein the electrically conductive top plate includes an annular channel having two adjacent annular legs on either side of the annular channel which sits atop the flange extending radially outward of the holder;

a lid plate disposed atop walls of the chamber body and configured to couple a chamber lid to the chamber body;

an isolator ring disposed about the gas distribution plate, the isolator ring having a body, a first portion extending radially outwardly from an upper portion of the body and disposed atop a portion of the lid plate, and a second portion extending radially inwardly from a lower portion of the body, wherein the second portion is adjacent the gas distribution plate, and wherein a gap is disposed between the gas distribution plate and the second portion to accommodate thermal expansion of the gas distribution plate;

a washer ring disposed between the holder and the isolator ring to support the holder;

a radio frequency (RF) power source electrically coupled to the electrically conductive top plate to deliver RF energy to the substrate processing chamber, wherein the electrically conductive top plate is formed of an electrically conductive material; and an RF gasket disposed between the flange extending radially outwardly and the electrically conductive top plate to facilitate coupling of RF energy from the electrically conductive top plate, through the holder, and into the gas distribution plate.

2. The substrate processing chamber of claim 1, wherein the first heater includes one or more first resistive heater elements or one or more first heating lamps.

3. The substrate processing chamber of claim 1, wherein the wall has a thickness between about 0.015 inches and about 0.2 inches.

4. The substrate processing chamber of claim 1, wherein the flange extending radially inwardly of the holder is coupled to an upper surface of the gas distribution plate.

5. The substrate processing chamber of claim 1, wherein the holder is formed of an electrically conductive material having a thermal conductivity less than about 30 W/m·K.

6. The substrate processing chamber of claim 1, wherein the gap is between about 0.04 inches when the gas distribution plate is at maximum thermal expansion and about 0.08 inches when the gas distribution plate is at room temperature.

7. The substrate processing chamber of claim 1, wherein a lower surface of the heater plate is entirely exposed to the gas distribution plate.

\* \* \* \* \*